(12) United States Patent
Sun

(10) Patent No.: US 10,197,919 B2
(45) Date of Patent: Feb. 5, 2019

(54) ADJUSTING DEVICE AND ADJUSTING METHOD FOR EXPOSURE DEVICE

(71) Applicant: SHANGHAI MICRO ELECTRONICS EQUIPMENT CO., LTD., Shanghai (CN)

(72) Inventor: Jinglu Sun, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 15/523,140

(22) PCT Filed: Oct. 27, 2015

(86) PCT No.: PCT/CN2015/092900
§ 371 (c)(1),
(2) Date: Apr. 28, 2017

(87) PCT Pub. No.: WO2016/066076
PCT Pub. Date: May 6, 2016

(65) Prior Publication Data
US 2017/0322493 A1 Nov. 9, 2017

(30) Foreign Application Priority Data
Oct. 29, 2014 (CN) .......................... 2014 1 0597382

(51) Int. Cl.
*G03F 7/20* (2006.01)
*G02B 13/00* (2006.01)
(Continued)

(52) U.S. Cl.
CPC .......... *G03F 7/20* (2013.01); *G02B 13/0015* (2013.01); *G02B 13/18* (2013.01); *G02B 15/00* (2013.01);
(Continued)

(58) Field of Classification Search
CPC ............. G03F 7/70308; G03F 7/70266; G03F 7/70641; G03F 7/70625; G03F 7/20;
(Continued)

(56) References Cited

U.S. PATENT DOCUMENTS

2002/0005940 A1   1/2002 Hatada et al.

FOREIGN PATENT DOCUMENTS

CN           1452017 A    10/2003
CN         101142534 A    3/2008
(Continued)

*Primary Examiner* — Michelle M Iacoletti
(74) *Attorney, Agent, or Firm* — Muncy, Geissler, Olds & Lowe, P.C.

(57) ABSTRACT

An adjustment apparatus which is an optical system having an incident face and a light exit face that is parallel to the incident face. The optical system is disposed in an exposure device. The adjustment apparatus includes at least one wedge lens and a plurality of optical lenses configured such that at least one of focal plane adjustment, magnification adjustment and position adjustment for a field of view corresponding to the exposure device is made possible through changing relative positions of at least one pair of neighboring ones of the lenses. An adjustment method corresponding to the adjustment apparatus is also provided for the focal plane adjustment, magnification adjustment and position adjustment for the field of view corresponding to the exposure device.

26 Claims, 6 Drawing Sheets

(51) Int. Cl.
  *G02B 13/08* (2006.01)
  *G02B 15/14* (2006.01)
  *G02B 17/08* (2006.01)
  *G02B 15/00* (2006.01)
  *G02B 13/18* (2006.01)

(52) U.S. Cl.
  CPC ............. *G02B 15/14* (2013.01); *G02B 17/08* (2013.01); *G03F 7/70241* (2013.01); *G03F 7/70258* (2013.01); *G03F 7/70266* (2013.01); *G03F 7/70308* (2013.01); *G03F 7/70625* (2013.01); *G03F 7/70641* (2013.01)

(58) Field of Classification Search
  CPC . G03F 7/70241; G02B 13/0015; G02B 13/18; G02B 15/14; G02B 17/08
  See application file for complete search history.

(56) References Cited

FOREIGN PATENT DOCUMENTS

| | | | |
|---|---|---|---|
| CN | 101551508 | A | 10/2009 |
| CN | 102472987 | A | 5/2012 |
| CN | 103364963 | A | 10/2013 |
| JP | 2003-309053 | A | 10/2003 |
| JP | 2004-200430 | A | 7/2004 |
| JP | 2004-335692 | A | 11/2004 |
| JP | 2005-24584 | A | 1/2005 |
| JP | 2005331694 | A | 12/2005 |
| JP | 2010039347 | A | 2/2010 |
| JP | 2013-219089 | A | 10/2013 |
| TW | 200305788 | A | 11/2003 |
| TW | 200923418 | A | 6/2009 |

ADJUSTING DEVICE AND ADJUSTING METHOD FOR EXPOSURE DEVICE

TECHNICAL FIELD

The present invention relates to exposure devices and methods and, in particular, to an apparatus and method for adjusting an exposure device.

BACKGROUND

Flat panel display technology is evolving fast, with increasing size of flat panel displays being produced. Exposure using an objective with a large field of view (FoV) can effectively increase manufacturing yield. However, FoV enlargement for an objective optical system will raise difficulties in design, manufacturing and other aspects. A required large FoV can be alternatively achieved by putting together equally-sized FoVs of several proper objective lenses that are arranged in a certain style. The number of the used objectives is determined by the size of the required FoV. This approach can meet the needs for large FoVs, while reducing the optical processing and manufacturing difficulties and providing high compatibility and flexibility.

However, in the above approach, imaging locations of the individual objectives may deviate from their supposed positions due to their performance and assembly tolerances. In addition, the large-sized mask may undergo gravity-caused deformations which may lead to deviations in surface of the photosensitive substrate. For these reasons, each of the used objectives is provided with a separate adjustment apparatus for tuning its FoV to where it is supposed to be so as to ensure high quality of the combined FoV.

A scanning exposure device equipped with multiple projection optical systems that generate projection fields stepping forward by predetermined amounts of displacement in the scanning direction, with end portions of neighboring fields overlapping each other in a direction orthogonal to the scanning direction, is called a multi-lens scanning exposure device. With such a multi-lens scanning exposure device, the mask is illuminated through multiple illumination slits and is scanned together with the photosensitive substrate simultaneously in a direction orthogonal to the arrangement direction of the illumination slits so that the multiple projection optical systems corresponding to the respective illumination slits expose a pattern on the mask onto the photosensitive substrate.

Patent Application Publication No. JP2005331694A discloses an exposure device capable of focal plane adjustment by means of translating right-angle reflectors or a group of wedge plates. Focal plane adjustment by translation of the right-angle reflectors will lead to changes in the optimum positions for image and object planes and hence decrease in focal depth. In the approach using vertical translation of the wedge plates for focal plane adjustment, the distance between the two wedge plates will be changed resulting in translational displacement of the image plane in the Y-direction. This translation needs to be offset by means of rotation of parallel plates. Horizontal shifts of the image are enabled by rotating the two parallel plates respectively about the X- and Y-directions. Magnification adjustment is made possible by moving any of three half-lenses that constitute an afocal optical system, but however, at the same time, introduces a change in the focal plane which needs to be offset using the focal adjustment system.

Patent Application Publication No. US20020005940 discloses an exposure device capable of magnification adjustment by axial translation of an afocal optical system consisting of two lenses, and of focal plane adjustment by translation of an afocal optical system consisting of three lenses. The magnification adjustment by the axial translation of the afocal optical system consisting of the two lenses introduces changes in the focal plane, whilst the focal plane adjustment by translation based on the afocal optical system consisting of the three lenses causes changes in magnification. Therefore, either of the focal plane adjustment and magnification adjustment involves both of the devices for performing these tasks.

Therefore, magnification adjustment and focal plane adjustment are currently carried out using separate adjustment devices and introduces undesirable crosstalk that needs to be compensated for with other device(s). This leads to a cumbersome adjustment process.

SUMMARY OF THE INVENTION

It is an object of the present invention to provide an apparatus and method capable of performing focal plane, magnification and position adjustments either individually or simultaneously without introducing any other changes.

To achieve the above object, the present invention provides an adjustment apparatus which is an optical system having an incident face and a light exit face that is parallel to the incident face. The optical system is disposed in an exposure device. The adjustment apparatus comprises at least one wedge lens and a plurality of optical lenses, and wherein at least one of a focal plane a magnification and a position for a field of view (FoV) corresponding to the exposure device is adjustable through changing relative positions of at least one pair of neighboring ones of the lenses.

Further, the exposure device can comprise a light source, a mask, a projection optical system and a photosensitive substrate, wherein the adjustment apparatus is positioned between the mask and the projection optical system, or between the projection optical system and the photosensitive substrate, or within the projection optical system, and wherein the light source illuminates a pattern on the mask, thereby forming an image of the pattern which is then subjected to an optical path adjustment by the adjustment apparatus and projected and exposed onto the photosensitive substrate.

Further, the projection optical system can comprise at least one Dyson optical system, and the Dyson optical system can comprise a right-angle reflector, a lens and a concave reflector.

Further, the adjustment apparatus can be disposed between adjacent ones of the at least one Dyson optical system or between the right-angle reflector and the lens in one of the at least one Dyson optical system.

Further, the adjustment apparatus can comprise:

a first wedge lens having a first bevel and a first wedge angle;

a first optical lens having a second bevel and a first curved face opposing the second bevel, the second bevel proximal and parallel to the first bevel, the second bevel having the first wedge angle, the first curved face having a first radius of curvature;

a second optical lens having a second curved face and a third curved face opposing the second curved face, the second curved face proximal to the first curved face, the second curved face having a second radius of curvature that is the same as or close to the first radius of curvature, the third curved face having a third radius of curvature; and a third optical lens having a fourth curved face proximal to the third curved face, the fourth curved face having a fourth radius of curvature that is the same as or close to the third radius of curvature.

Further, the first wedge angle of the adjustment apparatus can range from 0.5° to 10°.

Further, each of the first radius of curvature, the second radius of curvature, the third radius of curvature and the fourth radius of curvature can range from 200 mm to 2000 mm.

Further, the adjustment apparatus can comprise:

a first wedge lens having a first bevel and a first wedge angle;

a first optical lens having a second bevel and a first curved face opposing the second bevel, the second bevel proximal and parallel to the first bevel, the second bevel having the first wedge angle, the first curved face having a first radius of curvature;

a second optical lens having a second curved face and a third curved face opposing the second curved face, the second curved face proximal to the first curved face, the second curved face having a second radius of curvature that is the same as or close to the first radius of curvature, the third curved face having a third radius of curvature;

a third optical lens having a fourth curved face and a third bevel opposing the fourth curved face, the fourth curved face proximal to the third curved face, the fourth curved face having a fourth radius of curvature that is the same as or close to the third radius of curvature, the third bevel parallel to the first bevel, the third bevel having a second wedge angle; and a second wedge lens having a fourth bevel and a second wedge angle, the fourth bevel proximal to the third bevel and parallel to the first bevel.

Further, the first wedge angle of the adjustment apparatus can range from 0.5° to 10°.

The present invention also provides an adjustment method for use with an adjustment apparatus, comprising placing the adjustment apparatus in an exposure device. The adjustment apparatus is an optical system having an incident face and a light exit face that is parallel to the incident face and comprises at least one wedge lens and a plurality of optical lenses. The adjustment method further comprises adjusting at least one of a focal plane, a magnification adjustment and a position for a FoV corresponding to the exposure device through changing relative positions of at least one pair of neighboring ones of the lenses.

Further, the adjustment apparatus can comprise a first wedge lens, a first optical lens, a second optical lens and a third optical lens, and the first wedge lens can have a first bevel and a first wedge angle.

Further, the focal plane is adjusted by moving the first wedge lens in a direction of the first bevel.

Further, the magnification is adjusted by moving one or more of the first optical lens, the second optical lens and the third optical lens along an optical axis.

Further, the magnification is adjusted by moving one or more of the first optical lens, the second optical lens and the third optical lens along the optical axis and by moving the first wedge lens in the direction of the first bevel so that there is no focal plane change occurring during the adjusting the magnification.

Further, the position is adjusted by translational and/or rotational adjustment of the image exposed on the photosensitive substrate through tilting the adjustment apparatus as a whole and/or rotating the first wedge lens about the optical axis.

Further, the adjustment apparatus can further comprise a second wedge lens having a fourth bevel and a second wedge angle, wherein the fourth bevel is parallel to the first bevel.

Further, the focal plane can be adjusted by moving the first wedge lens or the second wedge lens with respect to each other in the direction of the first bevel.

Further, the magnification can be adjusted by moving one or more of the first optical lens, the second optical lens and the third optical lens along the optical axis.

Further, the magnification can be adjusted by moving one or more of the first optical lens, the second optical lens and the third optical lens along the optical axis and by moving one or more of the first wedge lens and the second wedge lens in the direction of the first bevel so that there is no focal plane change occurring during the magnification adjustment.

Further, the position can be adjusted by translational and/or rotational adjustment of the image exposed on the photosensitive substrate through tilting the adjustment apparatus as a whole and/or rotating the first wedge lens and/or the second wedge lens about an exposure optical path axis.

The present invention also provides an exposure device, comprising a light source, a mask, a photosensitive substrate and an adjustment apparatus as defined above. The light source illuminates a pattern on the mask, thereby forming an image of the pattern which is then subjected to an optical path adjustment by the adjustment apparatus and projected and exposed onto the photosensitive substrate.

Compared to the prior art, the present invention provides a set of uniquely configured adjustment apparatuses capable of individual or simultaneous focal plane, magnification and continuous translational adjustments, without introducing other changes during the adjustments.

In the figures: 1 denotes a light source; 2, a mask; 3, an adjustment apparatus; 4, a right-angle reflector; 5, a lens; 6, a concave reflector; 7, a right-angle reflector; 8, a lens; 9, a concave reflector; 10, a Dyson optical system; 11, a Dyson optical system; 12, a photosensitive substrate; 31, an optical lens; 32, an optical lens; 33, an optical lens; 34, a wedge lens; 35, an optical lens; 36, an optical lens; 37, an optical lens; 38, a wedge lens; ΔX, an amount of X-directional translation; ΔY, an amount of Y-directional translation; 13, a wedge lens; 14, an optical lens; 15, an optical lens; 16, an optical lens; and 17, a wedge lens.

DETAILED DESCRIPTION

Specific embodiments of the present invention will be described below in greater detail with reference to the accompanying drawings. Features and advantages of the invention will be more apparent from the following detailed description, as well as from the appended claims. It is noted that the accompanying drawings are provided in a very simplified form not necessarily presented to scale, with the only purpose of facilitating convenience and clarity in explaining the embodiments.

Figure 1:
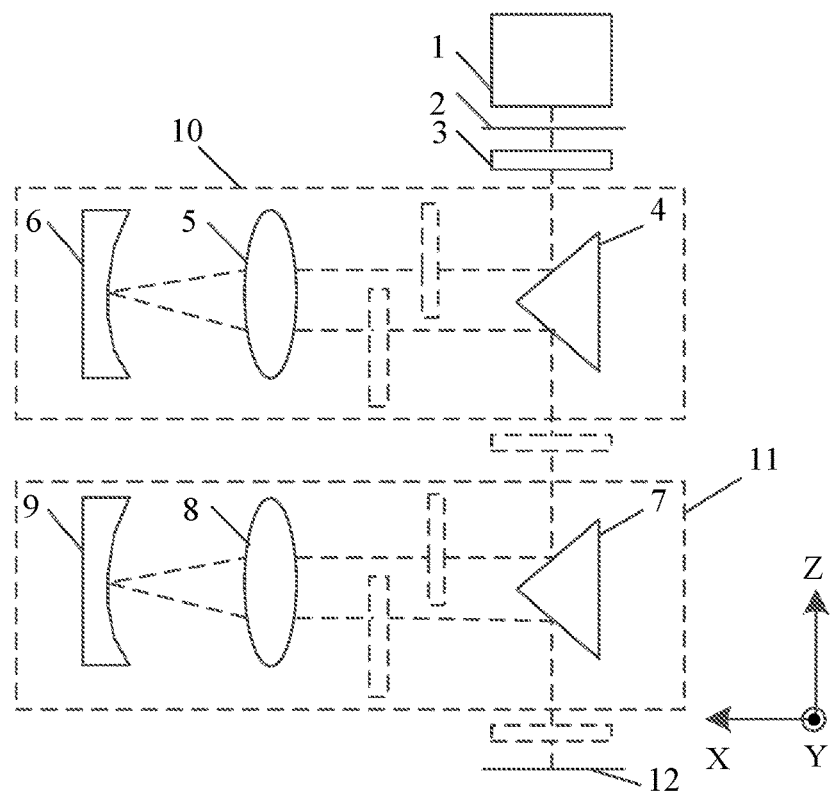
FIG. 1 shows a structural schematic of an optical system of an exposure device constructed in accordance with embodiments of the present invention.

FIG. 1 shows a structural schematic of an optical system of an exposure device constructed in accordance with the present invention. As shown in the figure, the exposure device includes a light source 1, a mask 2, an adjustment apparatus 3, a Dyson optical system 10, a Dyson optical system 11 and a photosensitive substrate 12. The Dyson optical system 10 includes a right-angle reflector 4, a lens 5 and a concave reflector 6. The Dyson optical system 11 includes a right-angle reflector 7, a lens 8 and a concave reflector 9. The adjustment apparatus 3, positioned between the mask 2 and the right-angle reflector 4, is, as a whole, an afocal optical system with two end faces (i.e., an incident face and a light exit face) that are parallel with respect to each other. That is, the system does not have an optical focus and thus not have a converging effect on light passing through it. The adjustment apparatus 3 may be disposed at one of several other locations such as, but not limited to, any of those indicated in the dashed boxes without numeral references in FIG. 1. Further, the adjustment apparatus 3 can be arranged in any optical path that allows image field adjustment. The light source 1 illuminates a pattern on the mask 2, thereby forming an image of the pattern which is then exposed onto the photosensitive substrate 12 via the adjustment apparatus and the Dyson optical systems 10 and 11.

The exposure device may comprise at least one Dyson optical system. Although it has been shown in FIG. 1 that the exposure device has two Dyson optical systems, i.e., the Dyson optical system 10 and 11, this is only for facilitating the explanation of the exposure device and the number of the Dyson optical systems is not limited to two. In addition, according to practical needs, the Dyson optical system(s) may be displaced by other optical system(s).

Embodiment 1

Figure 2A:
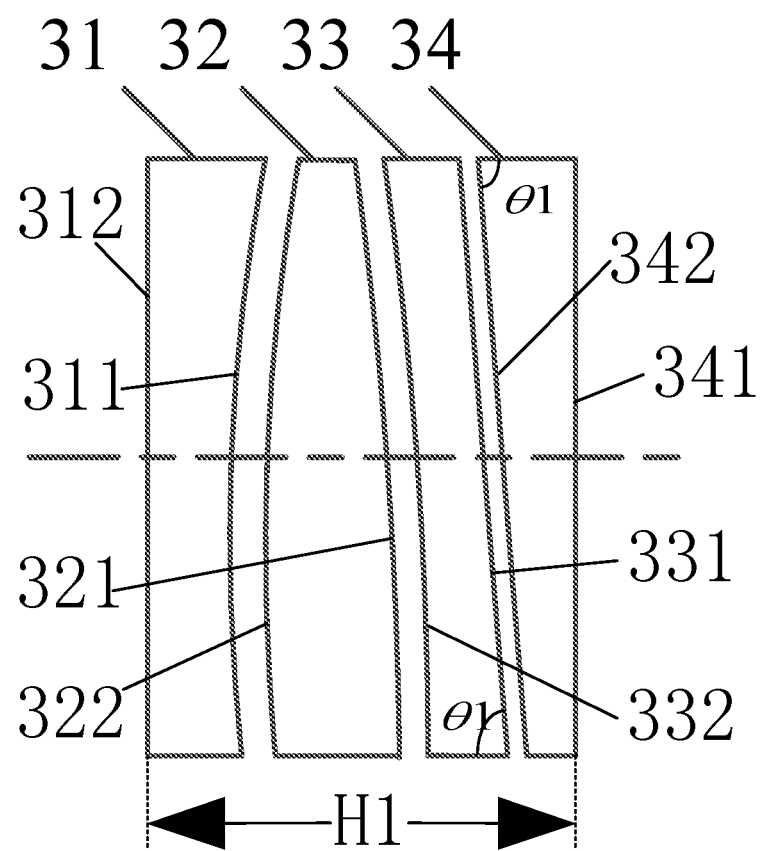
FIG. 2A shows a structural schematic of an adjustment apparatus according to a first embodiment of the present invention.

FIG. 2A shows an adjustment apparatus 3 according to a first embodiment of the present invention, having an incident face 341 and a light exit face 312, which are parallel to each other, as well as a thickness of H1. The adjustment apparatus includes:

a first wedge lens 34 having a first bevel 342 and a first wedge angle θ1;

a first optical lens 33 having a second bevel 331 and a first curved face 332 opposing the second bevel 331, the second bevel 331 proximal and parallel to the first bevel 342, the second bevel 331 having the first wedge angle θ1, the first curved face 332 having a first radius of curvature R1;

a second optical lens 32 having a second curved face 321 and a third curved face 322 opposing the second curved face 321, the second curved face 321 being proximal to the first curved face 332 and having a second radius of curvature R2 that is the same as or close to the first radius of curvature R1, the third curved face 322 having a third radius of curvature R3; and a third optical lens 31 having a fourth curved face 311 proximal to the third curved face 322, the fourth curved face 311 having a fourth radius of curvature R4 that is the same as or close to the third radius of curvature R3.

Each of the first radius of curvature R1, the second radius of curvature R2, the third radius of curvature R3 and the fourth radius of curvature R4 of the adjustment apparatus 3 is within the range of from 200 mm to 2000 mm. The lens components in the adjustment apparatus 3 are made of a highly ultraviolet transmissive material. The first wedge angle θ1 of the adjustment apparatus 3 is in the range from 0.5° to 10°.

Each of the optical lenses 31, 32 and 33 may be a complete circular lens or part thereof, and the curvature directions of their faces are not limited to those shown in FIG. 2A. In the optical path of the adjustment apparatus 3, the lenses 31 to 34 may be arranged either from the lens 31 to the lens 34 or from the lens 34 to the lens 31. The optical lens 31 and 33 may either be plano-convex lenses or plano-concave lenses. The optical lens 32 may be a biconvex lens, a biconcave lens or a meniscus lens. Wedge faces of the adjustment apparatus 3 are oriented as shown in FIG. 2A.

Figure 3A:
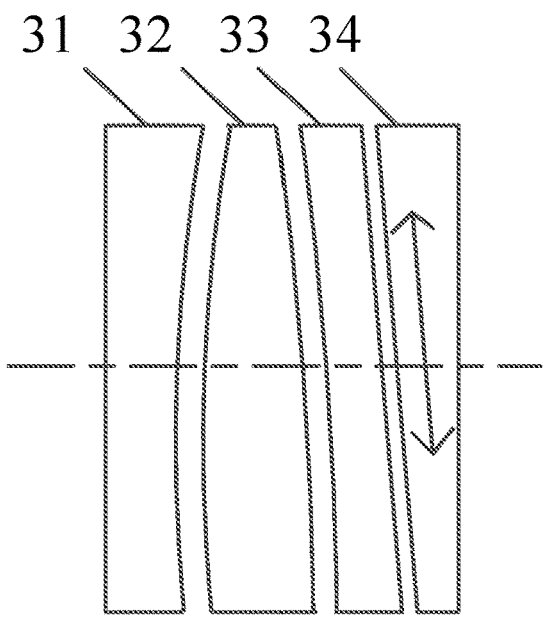
FIG. 3A schematically illustrates focal plane adjustment by the adjustment apparatus according to the first embodiment of the present invention.

As shown in FIG. 3A, the wedge lens 34 is moveable in a direction parallel to its bevel, thereby changing its thickness in the optical path. This alters a length that light travels in the adjustment apparatus 3 and hence causes a change in the focal plane. In addition, as the air spacing between the optical lens 33 and the wedge lens 34 remains the same during the movement of the wedge lens 34 in the direction parallel to its bevel, the focal plane adjustment does not introduce horizontal displacement of the image.

A user can select the location of the adjustment apparatus 3 according to practical needs. Placement of the adjustment apparatus 3 between the mask 2 and the right-angle reflector 4 makes it possible to modify an optimum position for the mask, and placing it between the photosensitive substrate and the right-angle reflector 7 allows an optimum position for the photosensitive substrate to be changed.

Sensitivity of the focal plane adjustment is proportional to the first wedge angle θ1 of the first bevel 342, as well as to a refractive index of the material from which the wedge lens 34 is fabricated. Proper selection of the material and the first wedge angle θ1 makes it possible to provide appropriate focal plane adjustment sensitivity based on requirements of the optical system of the exposure device on the adjustment range and accuracy.

Figure 4A:
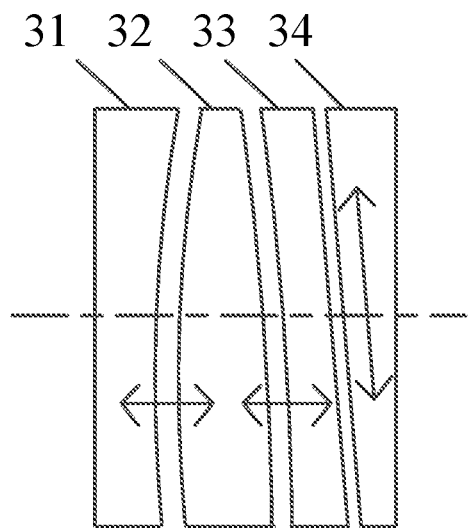
FIG. 4A schematically illustrates magnification adjustment by the adjustment apparatus according to the first embodiment of the present invention.

As shown in FIG. 4A, magnification of the optical system can be modified by changing either or both of the air spacing between the optical lenses 31 and 32 and the air spacing between the optical lenses 32 and 33. Additionally, translating the wedge lens 34 in the direction parallel to its bevel allows elimination of any change in the focal plane caused by the modification of the air spacing(s), thus achieving the magnification adjustment without other consequences.

Sensitivity of the magnification adjustment is related to the modified one(s) of the air spacings, and sensitivity determined by either of the two air spacings is related to the materials and radii of curvature of the two optical lenses that define the spacing. For example, as shown in FIG. 4A, sensitivity determined by the air spacing between the optical lens 31 and 32 is related to the material of the optical lens 31, the radius of curvature R4 of the optical lens 31, the material of the optical lens 32 and the radius of curvature R3 of the optical lens 32, and the same happens to the sensitivity determined by the air spacing between the optical lens 32 and 33. During designing of the optical system of the exposure device, sensitivity of mechanics, control and the like of the optical system can be optimized by selection of a proper combination of the materials and radii of curvature according to its requirements on the adjustment range and accuracy. For a fabricated adjustment apparatus 3, different sensitivities can be achieved through selecting different air spacings. During the designing, the radii of curvature and materials can be so selected that the two air spacings have different sensitivities. As such, different adjustment sensitivities adapted to different scenarios are achievable through adjusting either or both of the high- and low-sensitivity spacings.

Figure 5A:
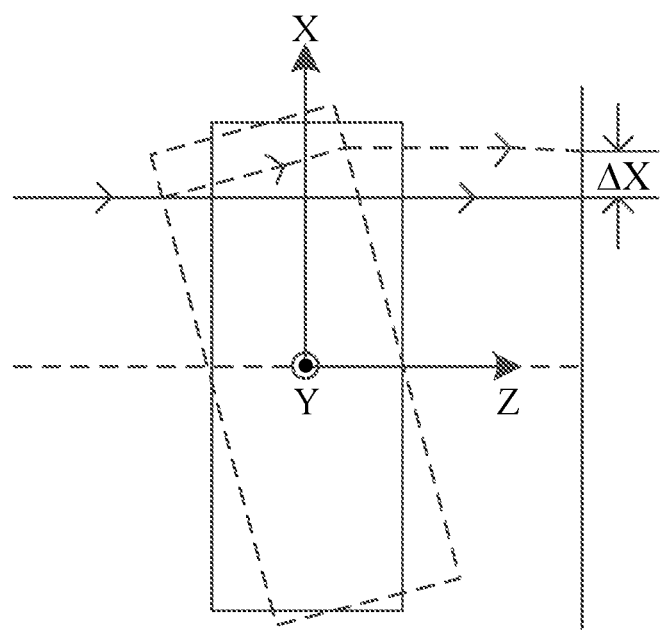
FIG. 5A schematically illustrates translational adjustment by the adjustment apparatus according to the first embodiment of the present invention.
Figure 5B:
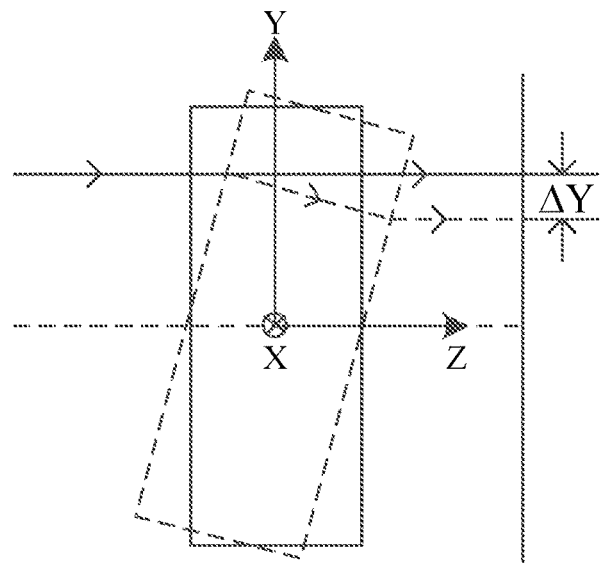
FIG. 5B schematically illustrates translational adjustment by the adjustment apparatus according to the second embodiment of the present invention.

FIGS. 5A and 5B are schematic diagrams showing translational adjustment by the adjustment apparatus 3.

Since the adjustment apparatus 3, as a whole, functions like a parallel plate, its rotation about the X-axis can cause the image plane to translate in the Y-direction, and its rotation about the Y-axis can lead to translational displacement of the image in the X-direction. FIGS. 5A and 5B illustrate X-directional translation of the image plane caused by the rotation of the adjustment apparatus 3 about the Y-axis and Y-directional translation of the image plane caused by its rotation about the X-axis. Wherein, the amounts of the X- and Y-directional translation are indicated by $\Delta X$ and $\Delta Y$, respectively.

Sensitivity of the translational adjustment is proportional to an aggregate refractive index of the materials of the four lenses 31, 32, 33 and 34, as well as, to the aggregate thickness H1 of them. Similarly, different sensitivities can be achieved by selecting different materials and lens thicknesses.

Further, the adjustment apparatus 3 is also capable of rotational adjustment. As shown in FIG. 2A, rotation of the pattern image on the photosensitive substrate is made possible by rotating the first wedge lens about the exposure optical path axis.

Detailed data of a specific embodiment of the adjustment apparatus 3 as shown in FIG. 2A is summarized in the following table 1. The four lenses of the adjustment apparatus 3 are all made of commonly-used fused silica allowing high transmission of ultraviolet light. The optical lens 31 is a plano-concave lens with a radius of curvature of 800 mm. The optical lens 32 is a biconvex lens having a radius of curvature of 800 mm proximal to the optical lens 31 and a radius of curvature 900 mm proximal to optical lens 33. The optical lens 33 has a radius of curvature 900 mm. The wedge lens 34 has a wedge angle of 5°, and the optical lens 33 has a wedge angle of 5° proximal to the wedge lens 34. Central thicknesses of the four lenses in the adjustment apparatus 3 are respectively 15 mm, 15 mm, 15 mm and 10 mm. The air spacing between the optical lenses 31 and 32 is 1.6 mm, that between the optical lenses 32 and 33 is 1.5 mm, and that between the optical lens 33 and the wedge lens 34 is 0.5 mm. In addition, as shown in Table 1, radii of curvature described as "infinite" indicate the corresponding lens surfaces being planar; the spaces between the four lenses are filled with air; and the radii of curvature and central thicknesses are all measured in mm.

TABLE 1

| Lens No. | Radius of Curvature | Material | Wedge Angle | Central Thickness | Air Spacing |
|---|---|---|---|---|---|
| 31 | Infinite | Fused silica | None | 15 | |
|    | 800 | The air | None | | 1.6 |
| 32 | 800 | Fused silica | None | 15 | |
|    | −900 | The air | None | | 1.5 |
| 33 | −900 | Fused silica | None | 15 | |
|    | Infinite | The air | 5° | | 0.5 |
| 34 | Infinite | Fused silica | 5° | 10 | |
|    | Infinite | The air | None | | |

The adjustment apparatus 3 is capable of focal plane adjustment, magnification adjustment and translational adjustment. The focal plane adjustment is accomplished by moving the wedge lens 34 along the direction parallel to its bevel and by changing the length that light travels in the adjustment apparatus 3 through increasing or reducing its thickness in the optical path. The magnification of the optical system can be modified through changing either or both of the air spacing between the optical lens 31 and 32 and the air spacing between the optical lens 32 and 33. Additionally, translating the wedge lens 34 in the direction parallel to its bevel allows elimination of any change in the focal plane caused by the modification of the air spacing(s), thus achieving the magnification adjustment without other consequences. Furthermore, rotating the whole adjustment apparatus 3 that functions like a parallel plate about the X-axis can cause the image plane to translate in the Y-direction, and about the Y-axis can lead to translational displacement of the image in the X-direction.

Sensitivity of focal plane adjustment for the adjustment apparatus 3 constructed in accordance with the detailed data presented in Table 1 is 28.125 nm/μm. That is, upon the wedge lens moving 1 μm obliquely upward along the direction parallel to its bevel of 5°, the focal plane will be shortened by 28.125 nm. This sensitivity is relatively low and poses low mechanical and control requirements, making it very easy to achieve accurate focal plane control.

Magnification adjustment sensitivity for the air spacing between the optical lenses 31 and 32 is 0.57 ppm/μm. That is, an increase of 10 μm in the air spacing will cause the magnification to increase by 5.7 ppm. The Magnification adjustment sensitivity for the air spacing between the optical lenses 32 and 33 is −0.53 ppm/μm. That is, an increase of 10 μm in the air spacing will lead to a reduction of 5.3 ppm of the system magnification. The reason why the absolute sensitivity values for the two spacings approach each other is the use of the same material and similar radii of curvature. Modification of only the air spacing between the optical lenses 31 and 32 (by axially moving the optical lens 31) can achieve fine magnification adjustment. A higher sensitivity such as 11 ppm/10 μm can be obtained when simultaneously changing the two air spacings in opposite directions (by axially moving the optical lens 32). The magnification adjustment will introduce slight changes in the focal plane which could be neutralized by performing focal plane compensating adjustment using the wedge lens 34.

The sensitivity of image plane translation by the adjustment apparatus 3 constructed in accordance with the data in Table 1 is 17.6 nm/μrad. That is, an amount of rotation of the adjustment apparatus 3, as a whole, of 1 μrad about the X-axis will cause the image plane to translate 17.6 nm in the Y-direction, and similarly, rotation of the adjustment apparatus 3 about the Y-axis by 1 μrad will lead to 17.6 nm of translational displacement of the image plane in the X-direction.

Embodiment 2

Figure 2B:
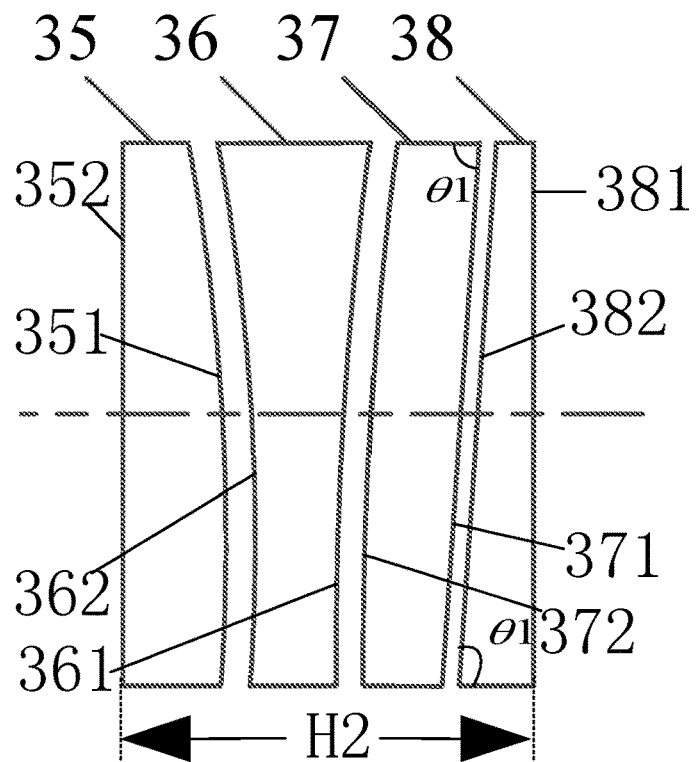
FIG. 2B shows a structural schematic of an adjustment apparatus according to a second embodiment of the present invention.

This embodiment differs from Embodiment 1 in that, as shown in FIG. 2B, an adjustment apparatus 3 according to Embodiment 2 having an incident face 381 and a light exit face 352, which are parallel to each other, as well as a thickness H2, comprises:

a first wedge lens 38 having a first bevel 382 and a first wedge angle θ1;

a first optical lens 37 having a second bevel 371 and a first curved face 372 opposing the second bevel 371, the second bevel 372 proximal and parallel to the first bevel 382, the second bevel 372 having the first wedge angle θ1, the first curved face 372 having a first radius of curvature R1;

a second optical lens 36 having a second curved face 361 and a third curved face 362 opposing the second curved face 361, the second curved face 361 being proximal to the first curved face 372 and having a second radius of curvature R2 that is the same as or close to the first radius of curvature R1, the third curved face 362 having a third radius of curvature R3; and a third optical lens 35 having a fourth curved face 351 proximal to the third curved face 362, the fourth curved face 351 having a fourth radius of curvature R4 that is the same as or close to the third radius of curvature R3.

Each of the first radius of curvature R1, the second radius of curvature R2, the third radius of curvature R3 and the fourth radius of curvature R4 of the adjustment apparatus 3 ranges from 200 mm to 2000 mm. The lenses in the adjustment apparatus 3 are made of a highly ultraviolet transmissive material. The first wedge angle θ1 of the adjustment apparatus 3 is in the range from 0.5° to 10°.

The rest structural features of this embodiment remain the same as those of Embodiment 1. Each of the optical lenses 35, 36 and 37 may be a complete circular lens or part thereof, and the curvature directions of their faces are not limited to those shown in FIG. 2B. In the optical path of the adjustment apparatus 3, the lenses 35 to 38 may be arranged either from the lens 35 to the lens 38 or from the lens 38 to the lens 35. The optical lens 35 and 37 may either be plano-convex lenses or plano-concave lenses. The optical lens 36 may be a biconvex lens, a biconcave lens or a meniscus lens. Wedge faces in the adjustment apparatus 3 are oriented as shown in FIG. 2B.

Figure 3B:
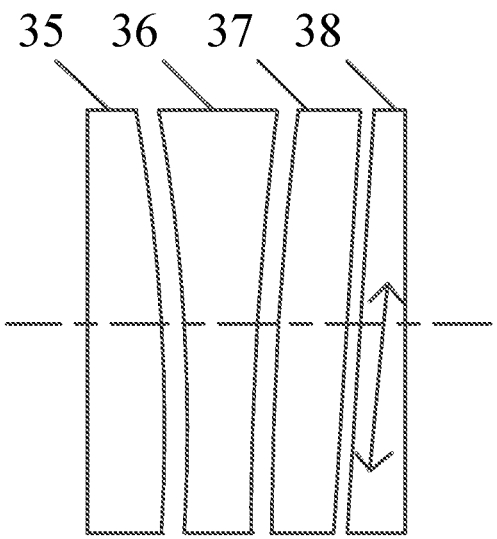
FIG. 3B schematically illustrates focal plane adjustment by the adjustment apparatus according to the second embodiment of the present invention.
Figure 4B:
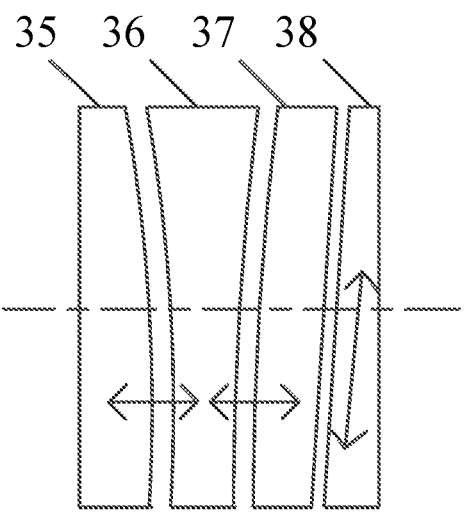
FIG. 4B schematically illustrates magnification adjustment by the adjustment apparatus according to the second embodiment of the present invention.

As the focal plane adjustment by the adjustment apparatus 3 shown in FIG. 3B is carried out in the same manner as shown in FIG. 3A and the magnification adjustment thereof shown in FIG. 4B is carried out in the same manner as shown in FIG. 4A, reference may be made to FIG. 3A and FIG. 4A for details in these regards, with further description being omitted.

FIGS. 5A and 5B show both the translational adjustment by the adjustment apparatus 3 according to Embodiment 1 and that by the adjustment apparatus 3 according to Embodiment 2.

Since the adjustment apparatus 3, as a whole, functions like a parallel plate, its rotation about the X-axis can cause the image plane to translate in the Y-direction, and its rotation about the Y-axis can lead to translational displacement of the image in the X-direction. FIGS. 5A and 5B illustrate X-directional translation of the image plane caused by the rotation of the adjustment apparatus 3 about the Y-axis and Y-directional translation of the image plane caused by its rotation about the X-axis. Wherein, the amounts of the X- and Y-directional translation are indicated by ΔX and ΔY, respectively.

Sensitivity of the translational adjustment is proportional to an aggregate refractive index of the materials of the four lenses 35, 36, 37 and 38, as well as, to the aggregate thickness H2 of them. Similarly, different sensitivities can be achieved by selecting different materials and lens thicknesses.

Furthermore, the adjustment apparatus 3 is also capable of rotational adjustment. As shown in FIG. 2B, rotation of the pattern image on the photosensitive substrate is made possible by rotating the first wedge lens about the exposure optical path axis.

Embodiment 3

Figure 6:
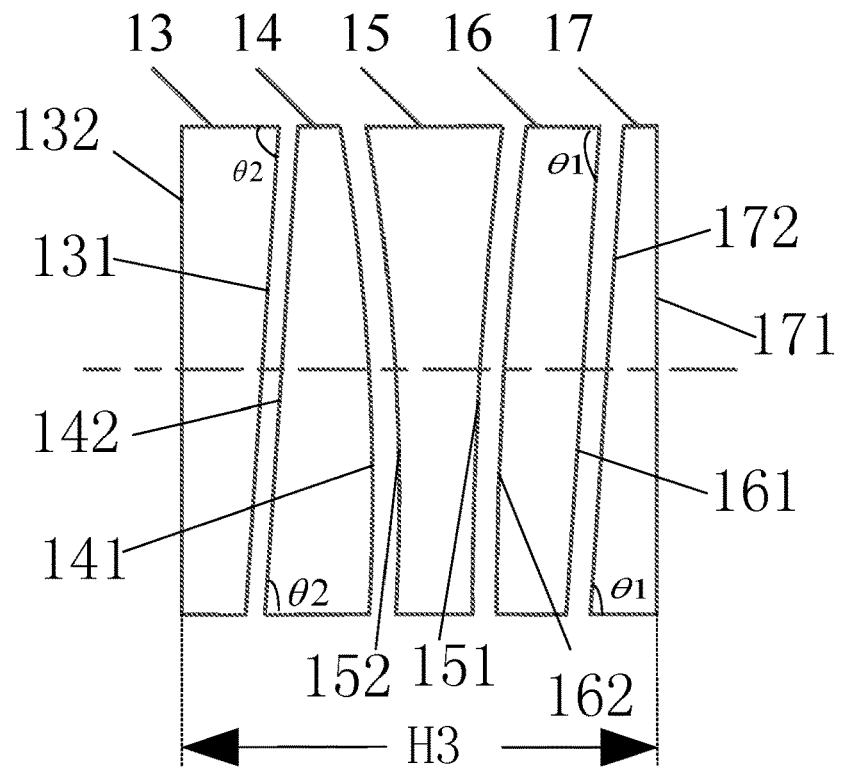
FIG. 6 shows a structural schematic of an adjustment apparatus according to a third embodiment of the present invention.

This embodiment differs from Embodiment 1 or 2 in that, as shown in FIG. 6, an adjustment apparatus 3 according to Embodiment 3 having an incident face 171 and a light exit face 132, which are parallel to each other, as well as a thickness H3, comprises:

a first wedge lens 17 having a first bevel 172 and a first wedge angle θ1;

a first optical lens 16 having a second bevel 161 and a first curved face 162 opposing the second bevel 161, the second bevel 161 proximal and parallel to the first bevel 172, the second bevel 161 having the first wedge angle θ1, the first curved face 162 having a first radius of curvature R1;

a second optical lens 15 having a second curved face 151 and a third curved face 152 opposing the second curved face 151, the second curved face 152 being proximal to the first curved face 162 and having a second radius of curvature R2 that is the same as or close to the first radius of curvature R1, the third curved face 152 having a third radius of curvature R3;

a third optical lens 14 having a fourth curved face 141 and a third bevel 142 opposing the fourth curved face 141, the fourth curved face 141 being proximal to the third curved face 152 and having a fourth radius of curvature R4 that is the same as or close to the third radius of curvature R3, the third bevel 142 being parallel to the first bevel 172 and having a second wedge angle θ2; and a second wedge lens 13 having a fourth bevel 131 and a second wedge angle θ2, the fourth bevel 131 proximal to the third bevel 142 and parallel to the first bevel 172.

In addition to the focal plane, magnification and translational adjustments as shown in FIGS. 2A and 2B, in the adjustment apparatus 3 according to the present embodiment, either of the first wedge lens 17 and second wedge lens 13 can be used to accomplish the focal plane adjustment, with the other enabling horizontal rotation of the image plane by rotation about the optical axis.

The rest structural features of this embodiment remain the same as those of Embodiment 1 or 2, and further description thereof is omitted herein.

The focal plane, magnification and translational adjustments in each of the above Embodiments 1, 2 and 3 can be used in combination or separately.

In summary, the present invention provides a set of uniquely configured adjustment apparatuses each capable of individual or simultaneous focal plane, magnification and continuous translational adjustments, without introducing other changes during the adjustments, including, for example, image plane translation during the focal plane adjustment, or changes in the focal plane during the magnification adjustment.

The foregoing description presents merely a few preferred embodiment examples of the present invention and does not limit the scope thereof in any sense. All equivalent substitutions or modifications made to the subject matter or features thereof disclosed herein by any person of ordinary skill in the art without departing from the scope of the present invention fall within the scope.

What is claimed is:

1. An adjustment apparatus, which is an optical system having an incident face and a light exit face that is parallel to the incident face, the optical system being disposed in an exposure device, wherein the adjustment apparatus comprises:
    a first wedge lens having a first bevel and a first wedge angle;
    a first optical lens having a second bevel and a first curved face opposing the second bevel, the second bevel proximal and parallel to the first bevel, the second bevel having the first wedge angle, the first curved face having a first radius of curvature;
    a second optical lens having a second curved face and a third curved face opposing the second curved face, the second curved face proximal to the first curved face, the second curved face having a second radius of curvature that is same as or substantially same as the first radius of curvature, the third curved face having a third radius of curvature; and
    a third optical lens having a fourth curved face proximal to the third curved face, the fourth curved face having a fourth radius of curvature that is same as or substantially same as the third radius of curvature, and
    wherein the adjustment apparatus is configured to adjust at least one of a focal plane, a magnification and a position for a field of view corresponding to the exposure device through changing relative positions of at least one pair of neighboring ones of the lenses.

2. The adjustment apparatus according to claim 1, wherein the exposure device comprises a light source, a mask, a projection optical system and a photosensitive substrate, wherein the adjustment apparatus is positioned between the mask and the projection optical system, or between the projection optical system and the photosensitive substrate, or within the projection optical system, and wherein the light source illuminates a pattern on the mask, thereby forming an image of the pattern which is then subjected to an optical path adjustment by the adjustment apparatus and projected and exposed onto the photosensitive substrate.

3. The adjustment apparatus according to claim 2, wherein the projection optical system comprises at least one Dyson optical system, the Dyson optical system comprising a right-angle reflector, a lens and a concave reflector.

4. The adjustment apparatus according to claim 3, wherein the adjustment apparatus is disposed between adjacent ones of the at least one Dyson optical system or between the right-angle reflector and the lens in one of the at least one Dyson optical system.

5. The adjustment apparatus according to claim 1, wherein the first wedge angle of the adjustment apparatus ranges from 0.5° to 10°.

6. The adjustment apparatus according to claim 1, wherein each of the first radius of curvature, the second radius of curvature, the third radius of curvature and the fourth radius of curvature ranges from 200 mm to 2000 mm.

7. The adjustment apparatus according to claim 1, wherein
    the third optical lens further has a third bevel opposing the fourth curved face, the third bevel parallel to the first bevel, the third bevel having a second wedge angle; and
    the adjustment apparatus further comprises a second wedge lens having a fourth bevel and the second wedge angle, the fourth bevel proximal to the third bevel and parallel to the first bevel.

8. The adjustment apparatus according to claim 7, wherein each of the first wedge angle and the second wedge angle of the adjustment apparatus ranges from 0.5° to 10°.

9. The adjustment apparatus according to claim 7, wherein each of the first radius of curvature, the second radius of curvature, the third radius of curvature and the fourth radius of curvature ranges from 200 mm to 2000 mm.

10. An adjustment method, comprising: placing an adjustment apparatus in an exposure device, wherein the adjustment apparatus is an optical system having an incident face and a light exit face that is parallel to the incident face and comprises a first wedge lens, a first optical lens, a second optical lens and a third optical lens, wherein the first wedge lens has a first bevel and a first wedge angle, wherein the adjustment method further comprises adjusting at least one of a focal plane, a magnification and a position of a field of view corresponding to the exposure device through changing relative positions of at least one pair of neighboring ones of lenses, and wherein the magnification is adjusted by moving one or more of the first optical lens, the second optical lens and the third optical lens along an optical axis and by moving the first wedge lens in a direction of the first bevel so that there is no focal plane change occurring during adjusting the magnification.

11. The adjustment method according to claim 10, wherein the focal plane is adjusted by moving the first wedge lens in a direction of the first bevel.

12. The adjustment method according to claim 10, wherein the magnification is adjusted by moving one or more of the first optical lens, the second optical lens and the third optical lens along an optical axis.

13. The adjustment method according to claim 10, wherein the position is adjusted by translational and/or rotational adjustment of an image exposed on a photosensitive substrate through tilting the adjustment apparatus as a whole and/or rotating the first wedge lens about an optical axis.

14. The adjustment method according to claim 10, wherein the adjustment apparatus further comprises a second wedge lens having a fourth bevel and a second wedge angle, the fourth bevel parallel to the first bevel.

15. The adjustment method according to claim 14, wherein the focal plane is adjusted by moving the first wedge lens or the second wedge lens with respect to each other in a direction of the first bevel.

16. The adjustment method according to claim 14, wherein the magnification is adjusted by moving one or more of the first optical lens, the second optical lens and the third optical lens along an optical axis and by moving one or more of the first wedge lens and the second wedge lens in a direction of the first bevel so that there is no focal plane change occurring during adjusting the magnification.

17. The adjustment method according to claim 14, wherein the position is adjusted by translational and/or rotational adjustment of an image exposed on a photosensitive substrate through tilting the adjustment apparatus as a whole and/or rotating the first wedge lens and/or the second wedge lens about an exposure optical path axis.

18. An exposure device, wherein the exposure device comprises a light source, a mask, a photosensitive substrate and an adjustment apparatus, wherein the adjustment apparatus comprises:
- a first wedge lens having a first bevel and a first wedge angle;
- a first optical lens having a second bevel and a first curved face opposing the second bevel, the second bevel proximal and parallel to the first bevel, the second bevel having the first wedge angle, the first curved face having a first radius of curvature;
- a second optical lens having a second curved face and a third curved face opposing the second curved face, the second curved face proximal to the first curved face, the second curved face having a second radius of curvature that is same as or substantially same as the first radius of curvature, the third curved face having a third radius of curvature; and
- a third optical lens having a fourth curved face proximal to the third curved face, the fourth curved face having a fourth radius of curvature that is same as or substantially same as the third radius of curvature, and
- wherein the light source illuminates a pattern on the mask, thereby forming an image of the pattern which is then subjected to an optical path adjustment by the adjustment apparatus and projected and exposed onto the photosensitive substrate.

19. The exposure device of claim 18, wherein the exposure device comprises a light source, a mask, a projection optical system and a photosensitive substrate, wherein the adjustment apparatus is positioned between the mask and the projection optical system, or between the projection optical system and the photosensitive substrate, or within the projection optical system, and wherein the light source illuminates a pattern on the mask, thereby forming an image of the pattern which is then subjected to an optical path adjustment by the adjustment apparatus and projected and exposed onto the photosensitive substrate.

20. The exposure device of claim 19, wherein the projection optical system comprises at least one Dyson optical system, the Dyson optical system comprising a right-angle reflector, a lens and a concave reflector.

21. The exposure device of claim 20, wherein the adjustment apparatus is disposed between adjacent ones of the at least one Dyson optical system or between the right-angle reflector and the lens in one of the at least one Dyson optical system.

22. The exposure device of claim 18, wherein the first wedge angle of the adjustment apparatus ranges from 0.5° to 10°.

23. The exposure device of claim 18, wherein each of the first radius of curvature, the second radius of curvature, the third radius of curvature and the fourth radius of curvature ranges from 200 mm to 2000 mm.

24. The exposure device of claim 18, wherein
- the third optical lens has a third bevel opposing the fourth curved face, the third bevel parallel to the first bevel, the third bevel having a second wedge angle; and
- the adjustment apparatus further comprises a second wedge lens having a fourth bevel and the second wedge angle, the fourth bevel proximal to the third bevel and parallel to the first bevel.

25. The exposure device of claim 24, wherein each of the first wedge angle and the second wedge angle of the adjustment apparatus ranges from 0.5° to 10°.

26. The exposure device of claim 24, wherein each of the first radius of curvature, the second radius of curvature, the third radius of curvature and the fourth radius of curvature ranges from 200 mm to 2000 mm.

* * * * *